(12) United States Patent
Mase (10) Patent No.: US 10,754,264 B2
(45) Date of Patent: Aug. 25, 2020

(54) LITHOGRAPHY APPARATUS, LITHOGRAPHY METHOD, DECISION METHOD, STORAGE MEDIUM, AND ARTICLE MANUFACTURING METHOD

(71) Applicant: CANON KABUSHIKI KAISHA, Tokyo (JP)

(72) Inventor: Tomohiro Mase, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/181,827

(22) Filed: Nov. 6, 2018

(65) Prior Publication Data
US 2019/0146363 A1 May 16, 2019

(30) Foreign Application Priority Data
Nov. 13, 2017 (JP) .................................. 2017-218411

(51) Int. Cl.
*G03F 7/20* (2006.01)
*G03F 9/00* (2006.01)

(52) U.S. Cl.
CPC ........ *G03F 9/7046* (2013.01); *G03F 7/70141* (2013.01); *G03F 9/7011* (2013.01)

(58) Field of Classification Search
CPC ............................ G03F 7/70141; G03F 9/7046
See application file for complete search history.

(56) References Cited

U.S. PATENT DOCUMENTS

| 5,602,644 | A | * | 2/1997 | Ota | G03F 9/7026 250/548 |
| 5,721,607 | A | * | 2/1998 | Ota | G03F 9/70 250/559.3 |
| 5,808,910 | A | * | 9/1998 | Irie | G03F 7/70425 250/491.1 |
| 5,986,766 | A | | 11/1999 | Koga et al. | |

(Continued)

FOREIGN PATENT DOCUMENTS

| CN | 105278266 A | 1/2016 |
| JP | H09218714 A | 8/1997 |

(Continued)

OTHER PUBLICATIONS

Office Action issued in Taiwanese Appln. No. 107136125 dated Oct. 23, 2019. English translation provided.

*Primary Examiner* — Deoram Persaud
(74) *Attorney, Agent, or Firm* — Rossi, Kimms & McDowell LLP (57) ABSTRACT

The present invention provides a lithography apparatus that forms patterns on substrates including a first substrate and a second substrate following the first substrate, the apparatus including a decision unit configured to obtain a first layout of a plurality of shot regions on a first substrate from detection values of marks in sample shot regions included in each of a plurality of different combinations each constituted by at least two sample shot regions, of sample shot regions where a detection unit has detected the marks in fine alignment with respect to the first substrate and decide sample shot regions included in one of the plurality of combinations as sample shot regions where the detection unit detects the marks in pre-alignment with respect to a second substrate based on the first layout.

12 Claims, 10 Drawing Sheets

(56) References Cited

U.S. PATENT DOCUMENTS

| | | | |
|---|---|---|---|
| 6,481,003 B1 | 11/2002 | Maeda | |
| 6,876,946 B2* | 4/2005 | Yasuda | G03F 9/7003 250/548 |
| 7,212,286 B2* | 5/2007 | Hoshi | G03F 9/7046 355/53 |
| 8,248,584 B2* | 8/2012 | Shiroiwa | G03B 27/42 355/52 |
| 8,384,900 B2* | 2/2013 | Koga | G03F 9/7003 250/548 |
| 8,390,809 B2 | 3/2013 | Hayashi | |
| 2006/0050274 A1* | 3/2006 | Matsumoto | G03F 9/7092 356/401 |
| 2007/0133864 A1* | 6/2007 | Morimoto | G03F 9/7003 382/151 |
| 2008/0309903 A1* | 12/2008 | Morimoto | G03F 9/7003 355/53 |
| 2009/0123874 A1* | 5/2009 | Nagayama | G03F 7/70525 430/311 |
| 2009/0219533 A1* | 9/2009 | Hayashi | G03F 9/7003 356/401 |
| 2010/0271609 A1* | 10/2010 | Tsujikawa | G01B 11/03 355/67 |
| 2010/0282956 A1 | 11/2010 | Kimba | |
| 2015/0022797 A1* | 1/2015 | Miyazaki | G03F 7/70616 355/67 |
| 2015/0074621 A1* | 3/2015 | Endo | G03F 9/7046 716/54 |
| 2015/0116688 A1* | 4/2015 | Endo | G03F 9/7003 355/72 |
| 2019/0072864 A1* | 3/2019 | Yoshioka | G03F 1/00 |

FOREIGN PATENT DOCUMENTS

| | | |
|---|---|---|
| JP | 2000156336 A | 6/2000 |
| JP | 2003163163 A | 6/2003 |
| JP | 2009212153 A | 9/2009 |
| TW | 200620407 A | 6/2006 |
| TW | 200952039 A1 | 12/2009 |
| TW | 201537309 A | 10/2015 |
| WO | 0019497 A1 | 4/2000 |

* cited by examiner

| FIRST SAMPLE SHOT REGION | SECOND SAMPLE SHOT REGION | CORRECTION VALUE (Mag.) | CORRECTION VALUE (Rot.) | CORRELATION DEGREE |
|---|---|---|---|---|
| SL1 | SL2 | 0.123 | 0.234 | — |
| SH1 | SH2 | 0.621 | -0.232 | 0.964 |
| SH1 | SH3 | 0.156 | 0.311 | 0.110 |
| SH1 | SH4 | 0.132 | 0.211 | 0.032 |
| ... | ... | ... | ... | ... |
| SH6 | SH4 | 0.139 | 0.252 | 0.034 |
| SH6 | SH5 | 0.167 | 0.182 | 0.096 |

FIG. 11

| FIRST SAMPLE SHOT REGION | SECOND SAMPLE SHOT REGION | CORRECTION VALUE (Mag.) | CORRECTION VALUE (Rot.) | TIME COST | CORRELATION DEGREE |
|---|---|---|---|---|---|
| SL1 | SL2 | 0.123 | 0.234 | — | — |
| SH1 | SH2 | 0.621 | -0.232 | 1.58 | 1.122 |
| SH1 | SH3 | 0.156 | 0.311 | 2.95 | 0.405 |
| SH1 | SH4 | 0.132 | 0.211 | 3.59 | 0.391 |
| ... | ... | ... | ... | ... | ... |
| SH6 | SH4 | 0.139 | 0.252 | 2.50 | 0.284 |
| SH6 | SH5 | 0.167 | 0.182 | 2.25 | 0.321 |

LITHOGRAPHY APPARATUS, LITHOGRAPHY METHOD, DECISION METHOD, STORAGE MEDIUM, AND ARTICLE MANUFACTURING METHOD

BACKGROUND OF THE INVENTION

Field of the Invention

The present invention relates to a lithography apparatus, a lithography method, a decision method, a storage medium, and an article manufacturing method.

Description of the Related Art

In recent years, with advances in the miniaturization and integration of semiconductor devices such as ICs and LSIs and liquid crystal display elements such as liquid crystal panels, the accuracy and function of exposure apparatuses have improved. The exposure apparatus sequentially transfers a pattern formed on an original (reticle) onto shot regions on a substrate (wafer) while moving the substrate. An exposure apparatus designed to collectively transfer a pattern onto shot regions is called a stepper. An exposure apparatus designed to transfer a pattern onto shot regions while scanning a stage is called a scanner.

In aligning an original with a substrate, an exposure apparatus is required to aligning (overlaying) the original with the substrate with an accuracy on the order of nanometers. Substrate position measurement as part of such alignment includes two types of processing, namely pre-alignment and fine alignment.

Pre-alignment is the processing of measuring the amount of positional shift caused when a substrate is placed on a substrate chuck and coarsely aligning the substrate with an accuracy that allows normal execution of fine alignment. Accordingly, pre-alignment requires mark detection with a scope having a wide field of view (detection range), and hence uses a low-magnification scope. The low-magnification scope has a wide field of view and can perform mark detection even when a positional shift is caused by a placement error of a substrate with respect to the substrate chuck. However, this scope does not have high accuracy, and hence cannot achieve alignment accuracy on the order of nanometers.

Fine alignment is the processing of measuring the position of a substrate placed on the substrate chuck after coarse correction of the positional shift of the substrate by pre-alignment, and then accurately aligning the substrate. Fine alignment uses a high-magnification scope having high detection accuracy with a narrow field of view to achieve alignment accuracy on the order of nanometers. In performing fine alignment, the position and shape of a substrate (the layout of shot regions) are obtained by statistic processing for the detection values of sample shot regions on the substrate. The obtained information is reflected in exposure on the substrate. Such techniques are disclosed in Japanese Patent Laid-Open No. 9-218714.

Japanese Patent Laid-Open No. 2009-212153 discloses a technique for shortening the time required for alignment processing to improve productivity, that is, throughput in an exposure apparatus. Japanese Patent Laid-Open No. 2009-212153 discloses that the last shot region on which mark detection is performed in pre-alignment is the same as the first shot region on which mark detection is performed in fine alignment. This can shorten the time required to drive a substrate stage in alignment processing and hence can improve productivity.

Various factors cause distortion in substrates. For example, such distortion includes distortion in a base material caused by an apparatus that has formed the base material and distortion in a substrate itself. In fine alignment, there are many shot regions on which mark detection is to be performed, that is, sample shot regions, which are arranged overall on the substrate. Accordingly, in fine alignment, even if some of sample shot regions include local distortion, detection values in sample shot regions, of all the sample shot regions, which include distortion can be excluded as abnormal values. Excluding abnormal values in this manner can obtain a correction value that properly expresses the distortion of the substrate.

In pre-alignment, however, although the larger the number of sample shot regions is, the higher the accuracy of pre-alignment, the processing time increases. In general, this makes it impossible to set many sample shot regions. Performing pre-alignment with a small number of sample shot regions makes it difficult to determine whether detection values in sample shot regions include abnormal values. Accordingly, when some of sample shot regions include distortion in pre-alignment, detection values in such sample shot regions cannot be excluded, and hence a correction value that properly expresses the distortion of the substrate cannot be obtained. Performing fine alignment using such a correction value will cause a large error in the alignment of the substrate (substrate stage). This makes it impossible for a high-magnification scope to capture a mark. This may cause a detection error. In fine alignment, if detection errors occur in many sample shots, it is determined that an error has occurred in fine alignment. This eventually leads to a decrease in throughput.

SUMMARY OF THE INVENTION

The present invention provides a lithography apparatus advantageous in performing pre-alignment and fine alignment.

According to one aspect of the present invention, there is provided a lithography apparatus that forms patterns on substrates including a first substrate and a second substrate following the first substrate, the apparatus including a detection unit configured to detect marks respectively provided in a plurality of shot regions on the substrate, a processing unit configured to perform pre-alignment and fine alignment following the pre-alignment with respect to the substrate, and a decision unit configured to obtain a first layout of a plurality of shot regions on the first substrate from detection values of the marks in sample shot regions included in each of a plurality of different combinations each constituted by at least two sample shot regions, of sample shot regions where the detection unit has detected the marks in the fine alignment with respect to the first substrate and decide sample shot regions included in one of the plurality of combinations as sample shot regions where the detection unit detects the marks in the pre-alignment with respect to the second substrate based on the first layout.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
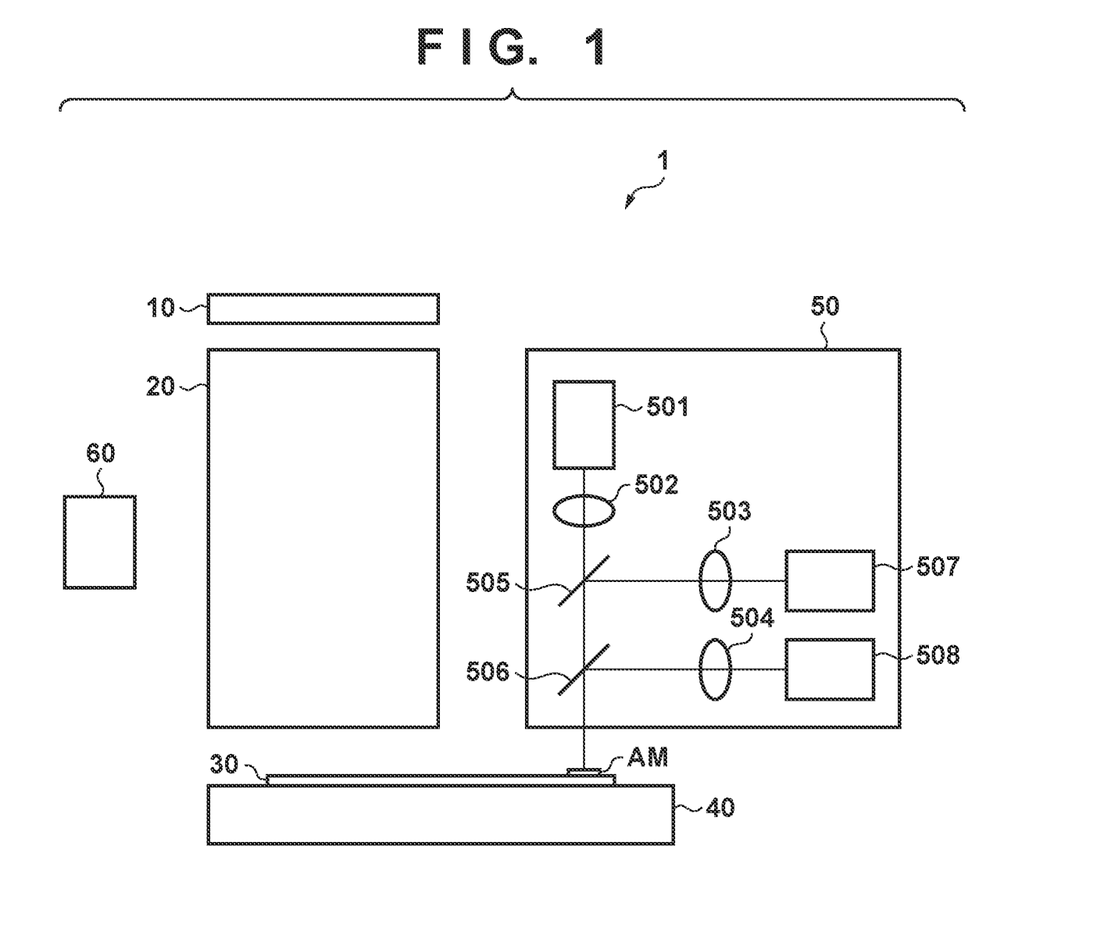
FIG. 1 is a schematic view showing the arrangement of an exposure apparatus according to one aspect of the present invention.

FIG. 1 is a schematic view showing the arrangement of an exposure apparatus 1 according to one aspect of the present invention. The exposure apparatus 1 is a lithography apparatus that is used for a lithography process as manufacturing process for a semiconductor device or liquid crystal display element to form a pattern on a substrate. The exposure apparatus 1 transfers a pattern formed on a reticle as an original onto a substrate (each shot region on the substrate) via a projection optical system.

The exposure apparatus 1 includes an illumination optical system (not shown), a reticle stage (not shown), a projection optical system 20, a substrate stage 40, an alignment detection unit 50, and a control unit 60. The illumination optical system illuminates a reticle 10 with light from a light source (not shown). The reticle stage is a movable stage that moves while holding the reticle 10.

The reticle 10 is an original on which a pattern (circuit pattern) to be transferred (formed) onto a substrate 30 is formed. The projection optical system 20 has a predetermined projection magnification and projects the pattern of the reticle 10 onto the substrate 30.

Figure 2:
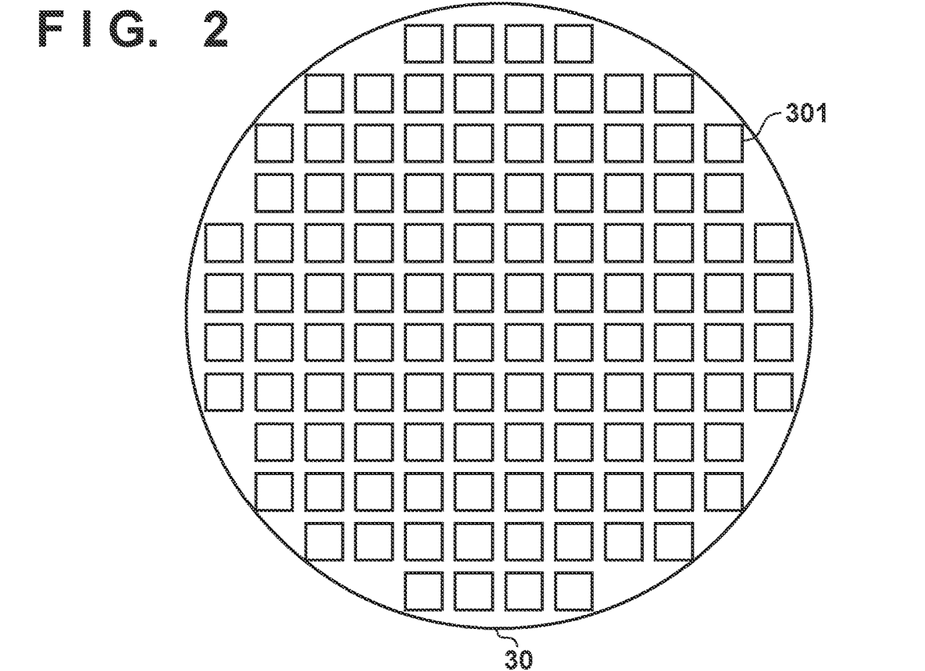
FIG. 2 is a view showing an example of the layout of shot regions on a substrate.

As shown in FIG. 2, a plurality of shot regions 301 as transfer regions of the pattern of the reticle, onto which the pattern has been transferred (formed) in the previous step, are arranged on the substrate 30 in a lattice pattern. Identical patterns are usually formed in the shot regions 301. In addition, alignment marks AM including an alignment mark for pre-alignment and an alignment mark for fine alignment are formed in each shot region 301.

The substrate stage 40 is a movable stage that three-dimensionally moves while holding the substrate 30. The reticle 10 held by the reticle stage and the substrate 30 held by the substrate stage 40 are arranged at optically conjugate positions (the object plane and image plane of the projection optical system 20) via the projection optical system 20.

The alignment detection unit 50 is an off-axis unit that can detect the alignment marks AM provided on each of the plurality of shot regions 301 on the substrate 30 at a plurality of magnifications. The alignment detection unit 50 includes a light source unit 501, imaging optical systems 502, 503, and 504, beam splitters 505 and 506, a first scope 507, and a second scope 508. Light from the light source unit 501 is transmitted through the beam splitters 505 and 506 and irradiates the alignment mark AM. Light reflected by the alignment mark AM is detected by the first scope 507 or the second scope 508. When the first scope 507 detects the light reflected by the alignment mark AM, the light from the alignment mark AM is transmitted through the beam splitter 506, reflected by the beam splitter 505, and enters the first scope 507 via the imaging optical system 503. On the other hand, when the second scope 508 detects the light reflected by the alignment mark AM, the light from the alignment mark AM is reflected by the beam splitter 506 and enters the second scope 508 via the imaging optical system 504.

The first scope 507 is a scope for low-magnification observation, which generates a mark image by detecting incident light via the imaging optical system 503. The first scope 507 generally has a field of view (detection range) of about 500 $\mu m^2$ to detect a positional shift (the positional shift of the substrate 30 with respect to the substrate stage 40) occurring when a substrate transfer apparatus transfers the substrate 30 onto the substrate stage 40. This field of view allows measurement of positions in two orthogonal directions (X and Y directions) using one alignment mark AM.

The second scope 508 is a scope for high-magnification observation, which has a magnification higher than that of the first scope 507. This scope generates a mark image by detecting incident light via the imaging optical system 504. The second scope 508 has a field of view narrower than that of the first scope 507 to accurately detect the position of the alignment mark AM. In this embodiment, the second scope 508 is configured to have a measurement accuracy lower than that in high-magnification observation and detect the alignment mark AM in a field of view wider than that in high-magnification observation. In other words, the second scope 508 also functions as a scope for intermediate-magnification observation.

The control unit 60 is implemented by, for example, a computer (information processing apparatus) including a CPU and a memory, and comprehensively controls the respective units (the substrate stage 40, the alignment detection unit 50, and the like) of the exposure apparatus 1. The control unit 60 controls exposure processing to expose the substrate 30 (that is, transfer the pattern of the reticle 10 onto the substrate 30). In this embodiment, the control unit 60 also controls alignment between the reticle 10 and the substrate 30, that is, alignment processing including pre-alignment and fine alignment as position measurement for the substrate 30. As described above, the control unit 60 functions as a processing unit for performing pre-alignment first and then performing fine alignment for the substrate 30. In such alignment processing, the control unit 60 can obtain the position of the alignment mark AM (so-called mark detection) provided on the substrate 30 from the mark image generated by the alignment detection unit 50.

Pattern matching processing is often used for mark detection in alignment processing such as pre-alignment or fine alignment. Pattern matching processing is roughly classified into two types of methods. One method is to binarize an image, perform matching between the binarized image and a template, and determine a position exhibiting the highest correlation as a mark position. The other method is to perform correlation computation between a grayscale image having undergone no change and a template having grayscale information. This method often uses a normalized correlation method or the like.

In performing pre-alignment, a positional shift occurring when the substrate transfer apparatus transfers the substrate 30 onto the substrate stage 40 is detected, and the substrate 30 is coarsely aligned with an accuracy that allows normal execution of fine alignment following pre-alignment. Accordingly, in pre-alignment, a scope having a wide field of view is used. This embodiment uses, as a low-magnification observation scope, the first scope 507 functioning as a scope for low-magnification observation or the second scope 508 functioning as a scope for intermediate-magnification observation.

In fine alignment, after the positional shift of the substrate 30 is coarsely corrected by pre-alignment, the position of the substrate 30 held by the substrate stage 40 is measured, and the substrate 30 is accurately aligned. Accordingly, fine alignment uses a scope having high measurement accuracy. This embodiment uses the second scope 508 functioning as a scope for high-magnification observation.

Figure 3:
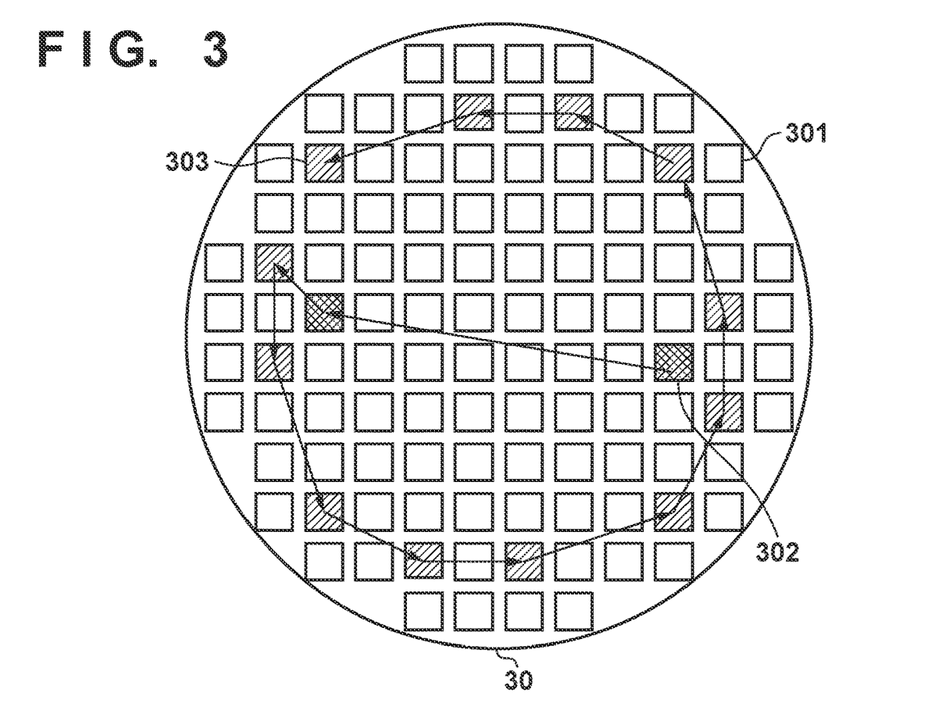
FIG. 3 is a view showing an example of sample shot regions selected from the shot regions on the substrate.

Alignment processing in this embodiment will be described in detail below. In alignment processing, as shown in FIG. 3, shot regions where the alignment detection unit 50 detects the alignment marks AM are selected (decided) from the plurality of shot regions 301 on the substrate 30, and the alignment mark AM in each shot region is detected. For example, referring to FIG. 3, sample shot regions 302 are selected as shot regions where the alignment detection unit 50 detects the alignment marks AM in pre-alignment. In pre-alignment, two or more shot regions are selected as the sample shot regions 302 from the plurality of shot regions 301. In addition, sample shot regions 303 are selected as shot regions where the alignment detection unit 50 detects the alignment marks AM in fine alignment. In fine alignment, the sample shot regions 303 larger in number than the sample shot regions 302 are selected from the plurality of shot regions 301 in accordance with the alignment accuracy required to expose the substrate 30.

Figure 4:
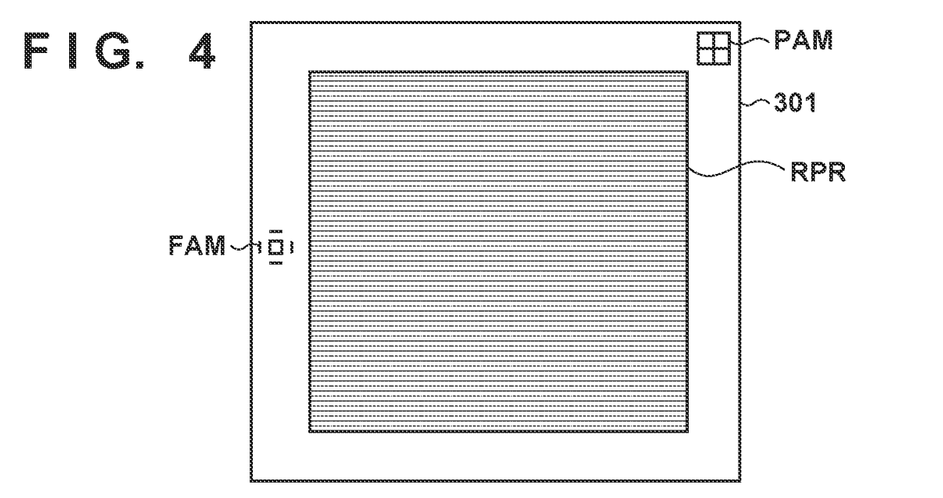
FIG. 4 is a view showing an example of the placement of alignment marks provided in each shot region on the substrate.
Figure 5:
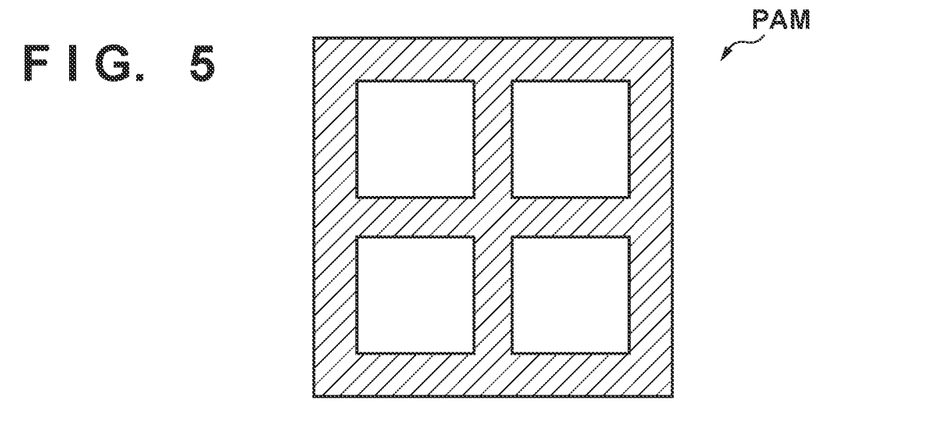
FIG. 5 is a view showing an example of the shape of a pre-alignment mark.
Figure 6:
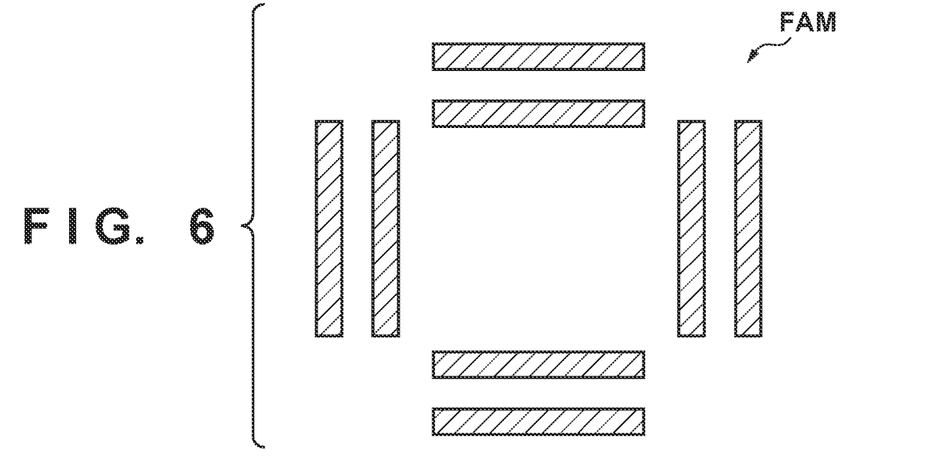
FIG. 6 is a view showing an example of the shape of a fine alignment mark.

FIG. 4 is a view showing an example of the placement of the alignment marks AM provided for each of the shot regions 301 on the substrate 30. As shown in FIG. 4, a pre-alignment mark PAM and a fine alignment mark FAM are provided as the alignment marks AM along the scribe line around a real pattern region (circuit pattern region) RPR in the shot region 301. The pre-alignment mark PAM is an alignment mark to be detected by the first scope 507 or the second scope 508 in pre-alignment, and has, for example, the shape shown in FIG. 5. The fine alignment mark FAM is an alignment mark to be detected by the second scope 508 in fine alignment, and has, for example, the shape shown in FIG. 6.

The alignment mark AM (the pre-alignment mark PAM or the fine alignment mark FAM) is a mark formed in a previous process, and is detected via a resist (photosensitizing agent) applied on the substrate 30. If the resist applied on the substrate 30 after the formation of the alignment marks AM is transparent, the marks can be detected even if they are not formed in the immediately preceding process.

In order to detect the alignment mark AM, the alignment mark AM must be moved to the field of view of the alignment detection unit 50 (the first scope 507 or the second scope 508) and kept at rest. Accordingly, the alignment marks AM are detected while the substrate stage 40 holding the substrate 30 is moved in the sequence indicated by the arrows in FIG. 3 (the substrate stage 40 is repeatedly moved and stopped). FIG. 3 shows as if the field of view of the alignment detection unit 50 were moved on the substrate. In practice, however, because the alignment detection unit 50 is fixed, the substrate stage 40, that is, the substrate 30 (the alignment marks AM), relatively moves in the directions opposite to the arrows.

Figure 7:
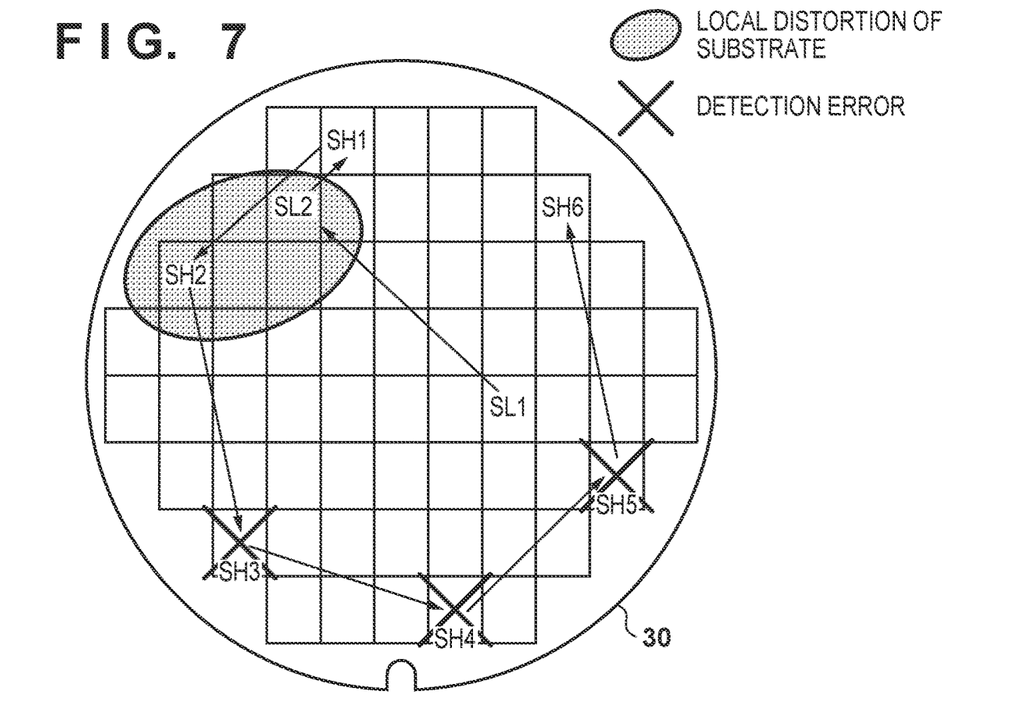
FIG. 7 is a view showing how local distortion occurs in a substrate.

As shown in FIG. 7, various factors sometimes cause local distortion in the substrate 30. In this case, although sample shot regions SL1 and SL2 are selected as shot regions where the alignment detection unit 50 detects the pre-alignment marks PAM in pre-alignment, local distortion has occurred near the sample shot region SL2. In addition, sample shot regions SH1, SH2, SH3, SH4, SH5, and SH6 are selected as shot regions where the alignment detection unit 50 detects the fine alignment marks FAM in fine alignment.

In fine alignment, the fine alignment marks FAM of the sample shot regions SH1 to SH6 for fine alignment are located in the field of view of the alignment detection unit 50 (second scope 508). More specifically, the substrate stage 40 is driven in accordance with the layout of shot regions (pre-alignment correction values) obtained from the detection values of the pre-alignment marks PAM in the sample shot regions SL1 and SL2 for pre-alignment. As shown in FIG. 7, when the sample shot region SL2 includes distortion, the pre-alignment correction values include an error. In this case, the fine alignment marks FAM in the sample shot regions SH1 to SH6 cannot be placed in the field of view of the alignment detection unit 50, and hence cannot be detected. That is, a detection error may occur. For example, referring to FIG. 7, detection errors have occurred in the sample shot regions SH3, SH4, and SH5. When detection errors occur in many sample shot regions in fine alignment in this manner, recovery processing is required (a fine alignment error is determined). This leads to a decrease in throughput.

Under the circumstances, this embodiment provides a technique advantageous in performing pre-alignment and fine alignment, that is, a technique of reducing detection errors in sample shot regions in fine alignment and suppressing a reduction in throughput.

Figure 8:
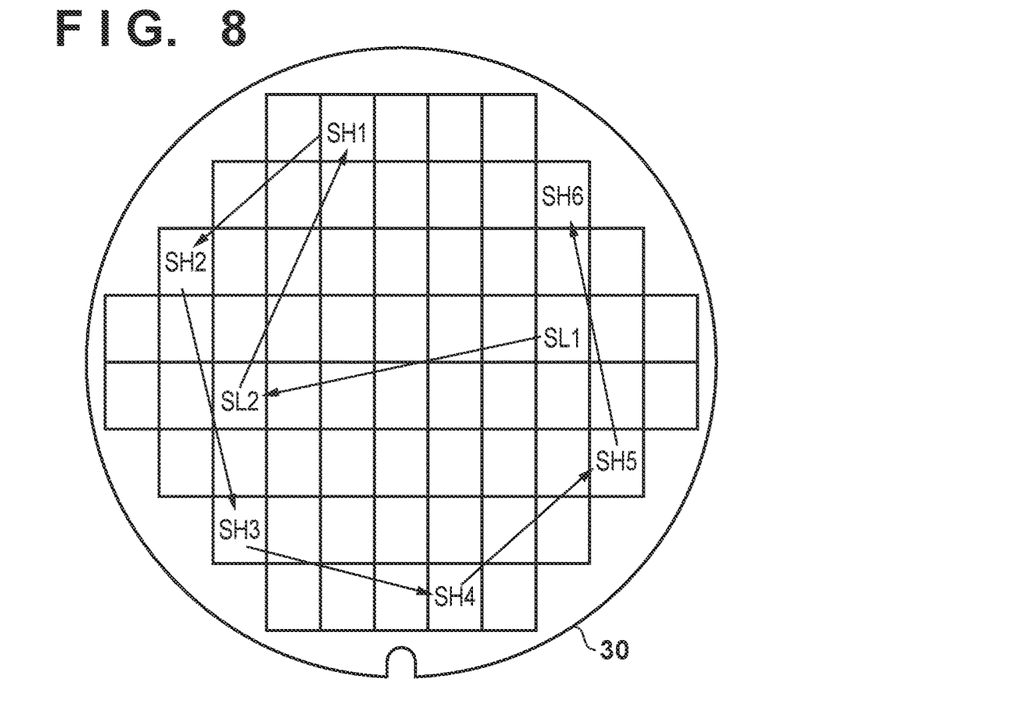
FIG. 8 is a view showing an example of sample shot regions selected from the shot regions on a substrate.
Figure 9A:
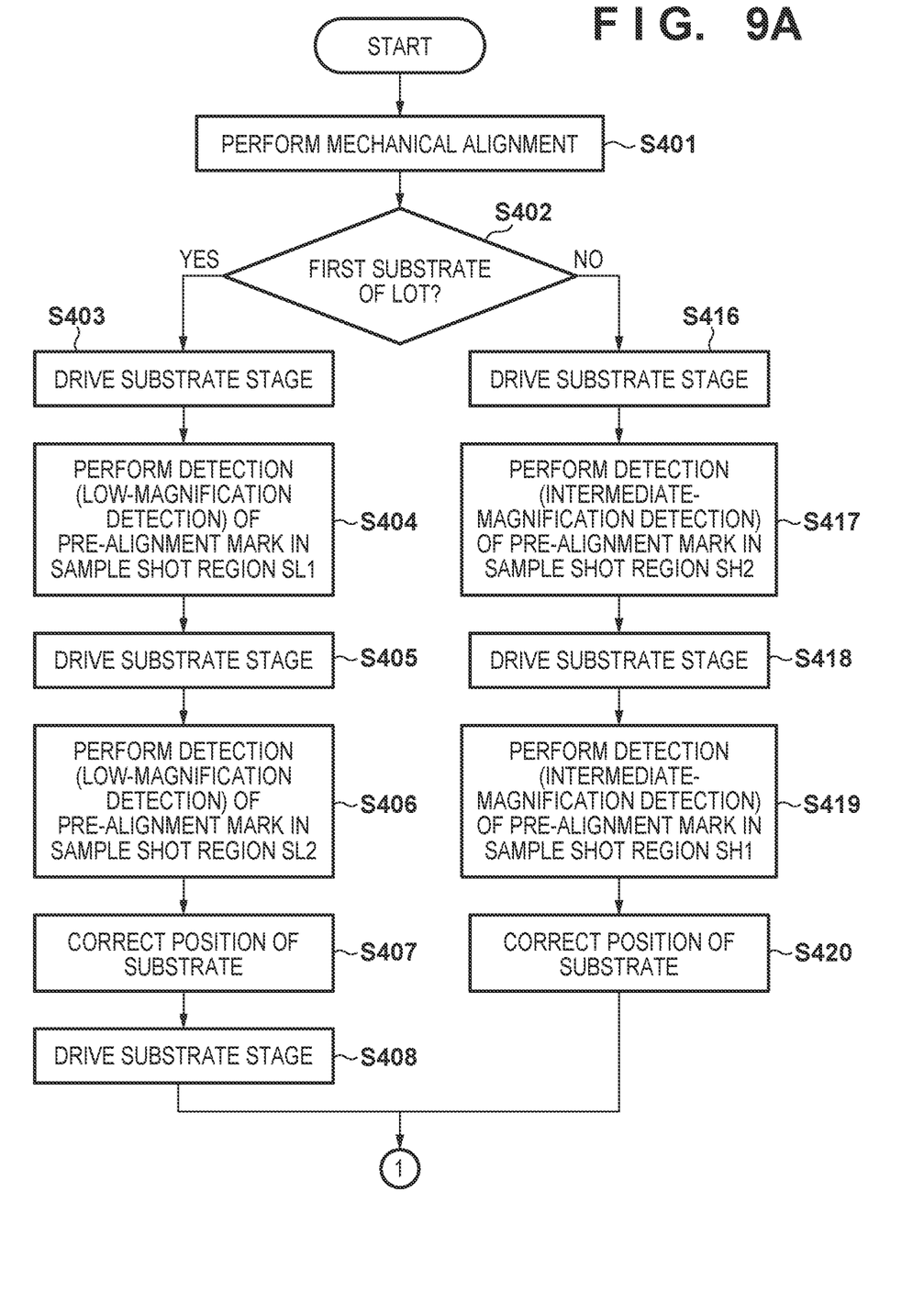
FIGS. 9A and 9B are flowcharts for explaining alignment processing and exposure processing in the exposure apparatus shown in FIG. 1.
Figure 9B:
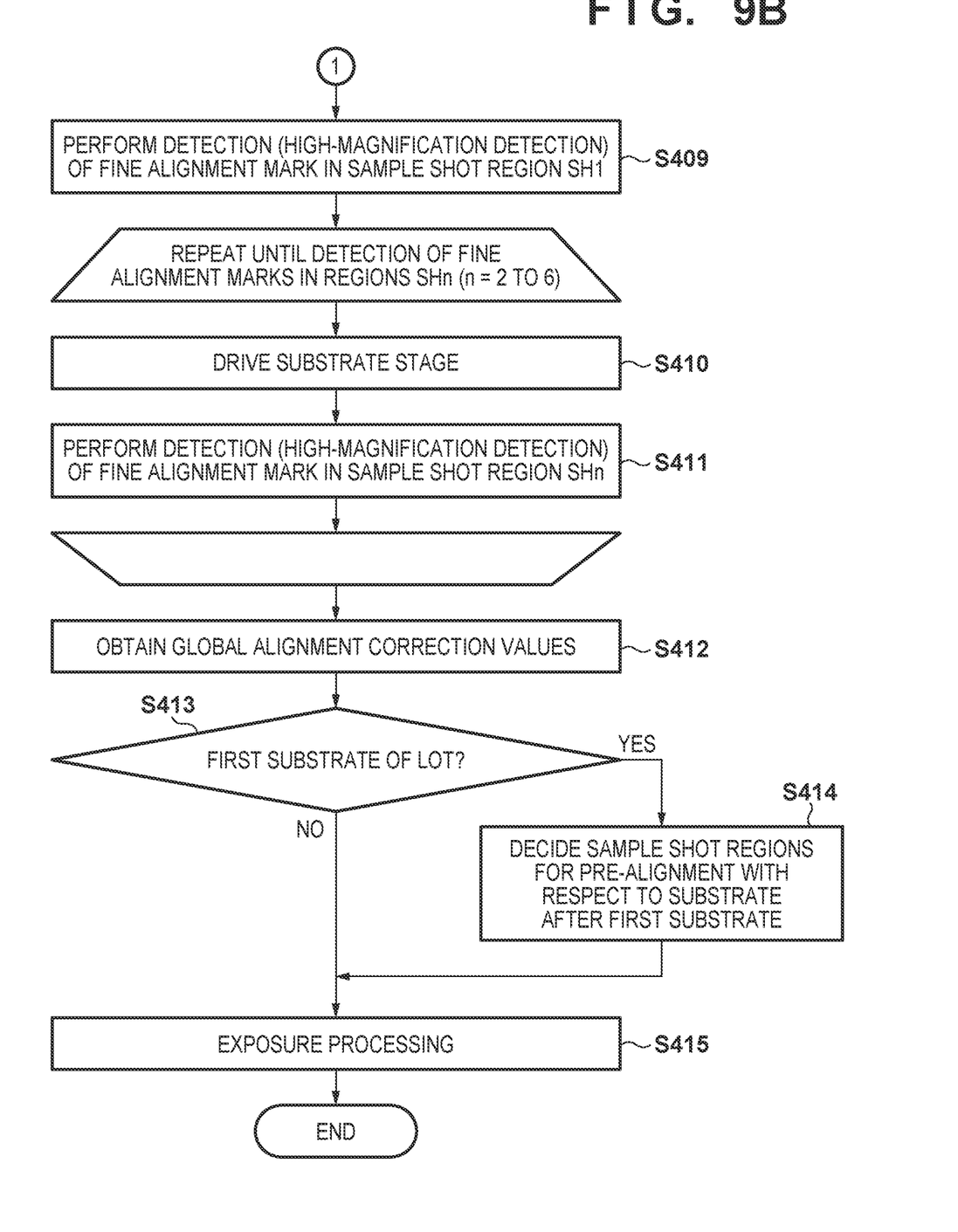

Alignment processing and exposure processing in the exposure apparatus 1 will be described with reference to FIGS. 9A and 9B. The control unit 60 performs such alignment processing and exposure processing by comprehensively controlling the respective units of the exposure apparatus 1. The following exemplifies a procedure from alignment processing to exposure processing with respect to the first substrate 30 (first substrate) of a lot to the subsequent substrate 30 (the second substrate following the first substrate). Assume that the sample shot regions SL1 and SL2 have been selected as shot regions where the alignment detection unit 50 detects the pre-alignment marks PAM in pre-alignment for the first substrate 30 of the lot, as shown in FIG. 8. In addition, assume that the sample shot regions SH1 to SH6 have been selected as shot regions where the alignment detection unit 50 detects fine alignment marks FAM in fine alignment for the first substrate 30 of the lot, as shown in FIG. 8.

In step S401, mechanical pre-alignment is performed. More specifically, the control unit 60 performs mechanical pre-alignment with reference to a notched portion of the substrate 30, for example, an orientation flat or notch via a mechanical pre-alignment unit (not shown).

In step S402, the control unit 60 determines whether the substrate 30 for which mechanical pre-alignment has been performed in step S401 is the first substrate 30 of the lot. If this substrate is the first substrate 30 of the lot, the process shifts to step S403. If the substrate is not the first substrate 30 of the lot, the process shifts to step S416.

In step S403, the control unit 60 drives the substrate stage 40 to locate the sample shot region SL1 in the field of view of the first scope 507. More specifically, the control unit 60 drives the substrate stage 40 to move the pre-alignment mark PAM in the sample shot region SL1 into the field of view of the first scope 507 based on a mechanical pre-alignment reference.

In step S404, the control unit 60 detects the pre-alignment mark PAM in the sample shot region SL1 by using the first scope 507 functioning as a scope for low-magnification observation (low-magnification detection).

In step S405, the control unit 60 drives the substrate stage 40 to locate the sample shot region SL2 in the field of view of the first scope 507. More specifically, the control unit 60 drives the substrate stage 40 to move the pre-alignment mark PAM in the sample shot region SL2 into the field of view of the first scope 507 based on a mechanical pre-alignment reference.

In step S406, the control unit 60 detects the pre-alignment mark PAM in the sample shot region SL2 by using the first scope 507 functioning as a scope for low-magnification observation (low-magnification detection).

In step S407, the control unit 60 corrects the position of the substrate 30 held by the substrate stage 40. More specifically, the control unit 60 obtains the layout of the shot regions on the substrate 30, that is, pre-alignment correction values, from the detection values of the pre-alignment marks PAM in the sample shot regions SL1 and SL2, which have been respectively obtained in steps S404 and S406. The control unit 60 then performs correction for position of the substrate 30, specifically shift correction, rotation correction, and magnification correction, based on the pre-alignment correction values.

In step S408, the control unit 60 drives the substrate stage 40 to locate the sample shot region SH1 in the field of view of the second scope 508. More specifically, the control unit 60 drives the substrate stage 40 to move the fine alignment mark FAM in the sample shot region SH1 into the field of view of the second scope 508.

In step S409, the control unit 60 detects the fine alignment mark FAM in the sample shot region SH1 by using the second scope 508 functioning as a scope for high-magnification observation (high-magnification detection).

In step S410, the control unit 60 drives the substrate stage 40 to locate the sample shot region SHn (n=2 to 6) in the field of view of the second scope 508. More specifically, the control unit 60 drives the substrate stage 40 to move the fine alignment mark FAM in the sample shot region SHn into the field of view of the second scope 508.

In step S411, the control unit 60 detects the fine alignment mark FAM in the sample shot region SHn by using the second scope 508 functioning as a scope for high-magnification observation (high-magnification detection).

The control unit 60 repeats steps S410 and S411 until detecting the fine alignment marks FAM in the sample shot regions SHn (n=2 to 6).

In step S412, the control unit 60 obtains global alignment correction values (fine alignment correction values). More specifically, the control unit 60 obtains the layout of the shot regions on the substrate 30, that is, global alignment correction values, from the detection values of the fine alignment marks FAM in the sample shot regions SH1 to SH6, which have been respectively obtained in steps S409 and S411.

In step S413, the control unit 60 determines whether the substrate 30 having undergone steps S409 to S412 is the first substrate 30 of the lot. If this substrate is the first substrate 30 of the lot, the process shifts to step S414. If the substrate is not the first substrate 30 of the lot, the process shifts to step S415.

In step S414, the control unit 60 decides (optimizes) sample shot regions for pre-alignment with respect to the substrate 30 after the first substrate based on the detection values of the fine alignment marks FAM in the sample shot regions SH1 to SH6, which have been respectively obtained in steps S409 to S411. Accordingly, the control unit 60 also functions as a decision unit that decides sample shot regions for pre-alignment. Note that to decide sample shot regions is to decide (select) sample shot regions for pre-alignment so as to properly obtain the shape of the substrate 30 after the first substrate, that is, the layout of shot regions.

Figure 10:
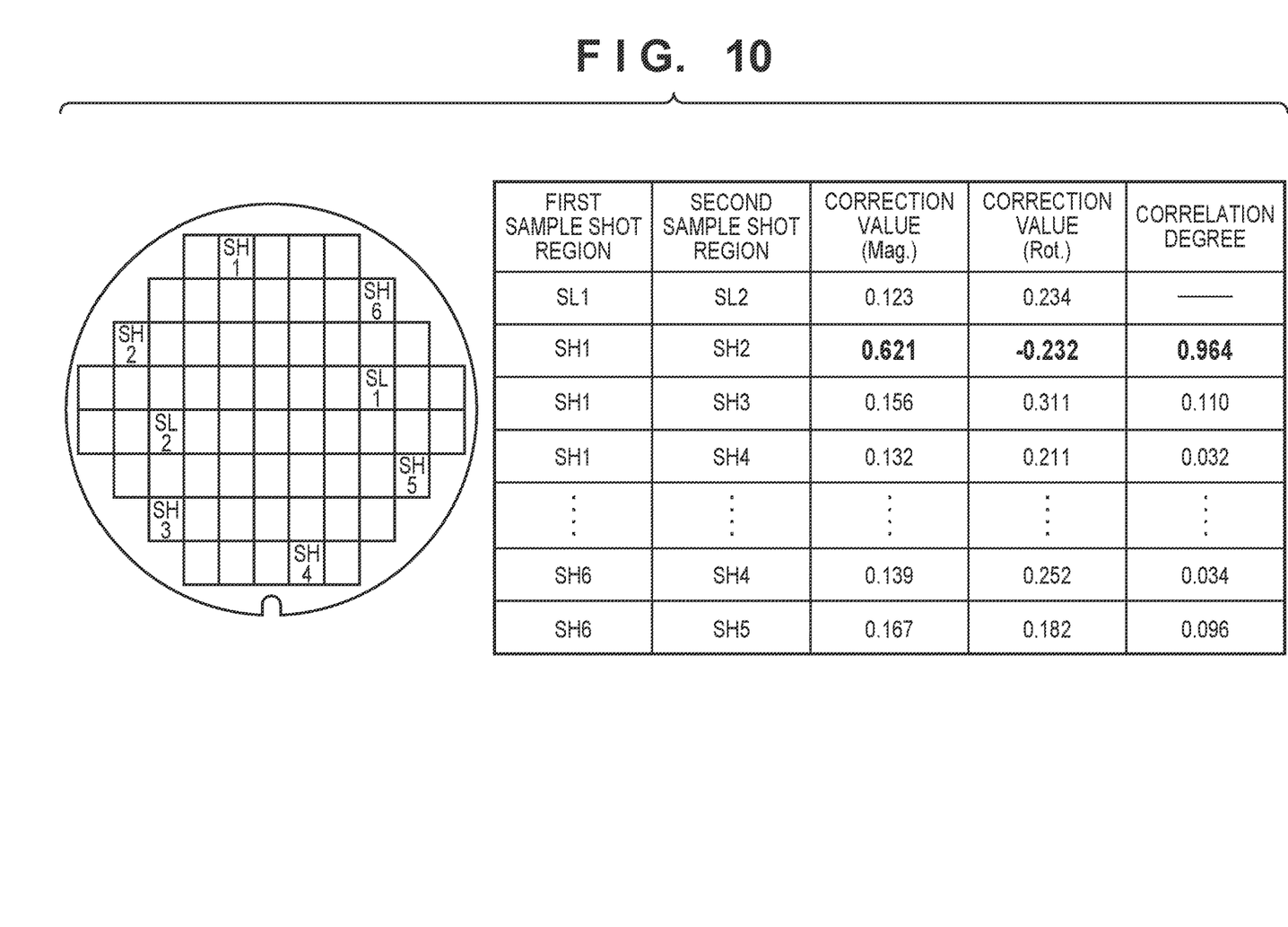
FIG. 10 is a view for explaining the processing of deciding sample shot regions for pre-alignment.

The processing of deciding sample shot regions for pre-alignment will be described in detail with reference to FIG. 10. First of all, the control unit 60 generates a plurality of different combinations each constituted by at least two sample shot regions of the sample shot regions SH1 to SH6 where marks have been detected in fine alignment with respect to the first substrate 30. In this case, as shown in FIG. 10, the control unit 60 generates a plurality of combinations each constituted by two sample shot regions (the first and second sample shot regions) of the sample shot regions SH1 to SH6.

The control unit 60 then obtains the layout of the shot regions on the first substrate 30, that is, pre-alignment correction values, from the detection values of the sample shot regions included in each of the plurality of combinations. In this case, as shown in FIG. 10, the control unit 60 obtains, as pre-alignment correction values, correction values concerning magnification (Mag.) and correction values (Rot.) concerning rotation.

The control unit 60 further obtains the degrees of separation, that is, the correlation degrees, between the pre-alignment correction values as references, obtained from the detection values of the sample shot regions SL1 and SL2 for pre-alignment, and the pre-alignment correction values obtained from the detection values of the sample shot regions included in the respective combinations.

The correlation degree can be obtained, for example, as follows. The respective elements of the pre-alignment correction values obtained from the detection values of the sample shot regions SL1 and SL2 are set as a correction value PreX concerning X, a correction value PreY concerning Y, a correction value Preθ concerning rotation, and a correction value PreMag concerning magnification. The respective elements of pre-alignment correction values obtained from the respective combinations are set as correction values C1X to CnX concerning X, correction values C1Y to CnY concerning Y, correction values C1θ to Cnθ concerning rotation, and correction values C1Mag to CnMag concerning magnification. In this case, degrees of correction Col_n can be obtained according to equation (1):

$$\text{Col\_}n = Wx(\text{Pre}X - CnX) + Wy(\text{Pre}Y - CnY) + W\theta(\text{Pre}\theta - Cn\theta) + W\text{mag}(\text{PreMag} - Cn\text{Mag}) \quad (1)$$

where Wx, Wy, Wθ, and Wmag are weighting coefficients to be given to the respective elements of the pre-alignment correction values.

Assume that, for example, the sample shot regions SH4 and SH5 include distortion. In this case, the degrees of separation between the pre-alignment correction values obtained from the combination including the sample shot regions SH4 and SH5 and the pre-alignment correction values obtained from the detection values of the sample shot regions SL1 and SL2 are large. That is, the degrees of correction are low. As described in FIG. 7, using in pre-alignment such sample shot regions including a combination of correction values exhibiting low correlation degrees will increase the possibility of causing detection errors in many sample shot regions in fine alignment. Accordingly, sample shot regions included in a combination exhibiting the highest correlation degrees are decided as sample shot regions for pre-alignment with respect to the substrate 30 after the first substrate of the lot. Referring to FIG. 10, therefore, the sample shot regions SH1 and SH2 are decided as sample shot regions for pre-alignment with respect to the substrate 30 after the first substrate of the lot.

Although sample shot regions included in a combination exhibiting the highest correlation degree are decided as sample shot regions for pre-alignment with respect to the substrate 30 after the first substrate of the lot in this embodiment, this is not exhaustive. For example, sample shot regions may be evaluated by obtaining a correlation with a fine alignment correction value or may be evaluated by setting a sample shot region as a reference independently of the sample shot regions SL1 and SL2.

The control unit 60 also obtains the evaluation values of the layout (first layout) of shot regions obtained from the respective combinations with respect to the layout (second layout) of shot regions obtained pre-alignment with respect to the first substrate 30 of the lot. The sample shot regions included in a combination falling within the allowable range of such evaluation values may be decided as sample shot regions for pre-alignment with respect to the substrate 30 after the first substrate of the lot.

Referring back to FIG. 9B, the control unit 60 performs exposure processing in step S415. More specifically, the control unit 60 exposes the substrate 30 while reflecting the global alignment correction values obtained in step S412, that is, performing global alignment.

If the control unit 60 determines in step S402 that the substrate is not the first substrate 30 of the lot, that is, the substrate is the substrate 30 after the first substrate of the lot, the process shifts to step S416, as described above. The sample shot regions SH1 and SH2 have been decided in step S414 as sample shot regions for pre-alignment with respect to the substrate 30 after the first substrate of the lot.

In step S416, the control unit 60 drives the substrate stage 40 to locate the sample shot region SH2 in the field of view of the second scope 508. More specifically, the control unit 60 drives the substrate stage 40 to move the pre-alignment mark PAM in the sample shot region SH2 into the field of view of the second scope 508.

In step S417, the control unit 60 detects the pre-alignment mark PAM in the sample shot region SH2 by using the second scope 508 functioning as a scope for intermediate-magnification observation (intermediate-magnification detection).

In step S418, the control unit 60 drives the substrate stage 40 to locate the sample shot region SH1 in the field of view of the second scope 508. More specifically, the control unit 60 drives the substrate stage 40 to move the pre-alignment mark PAM in the sample shot region SH1 into the field of view of the second scope 508.

In step S419, the control unit 60 detects the pre-alignment mark PAM in the sample shot region SH1 by using the second scope 508 functioning as a scope for intermediate-magnification observation (intermediate-magnification detection).

In step S420, the control unit 60 corrects the position of the substrate 30 held by the substrate stage 40. More specifically, the control unit 60 obtains the layout of the shot regions on the substrate 30, that is, pre-alignment correction values, from the detection values of the pre-alignment marks PAM in the shot regions SH1 and SH2, which have been respectively obtained in steps S417 and S419. The control unit 60 performs correction for position of the substrate 30, specifically shift correction, rotation correction, and magnification correction, based on the pre-alignment correction values.

As described above, according to this embodiment, shot regions including no local distortion can be set as sample shot regions for pre-alignment with respect to the first substrate 30 of the lot. This can reduce detection errors in sample shot regions in fine alignment, thereby suppressing a decreased in throughput.

Although this embodiment uses the second scope 508 functioning as a scope for intermediate-magnification observation in pre-alignment with respect to the first substrate 30 of the lot, the embodiment may use the first scope 507 functioning as a scope for low-magnification observation. Alternatively, the embodiment may use a third scope functioning as a scope for intermediate-magnification observation. In the embodiment, in pre-alignment with respect to the first substrate 30 of the lot, the pre-alignment marks PAM are detected in the order of the sample shot regions SH2 and SH1. This is because, the sample shot region SH1 is the first sample shot region in fine alignment with respect to the substrate 30 after the first substrate of the lot. This can save the trouble of driving the substrate stage 40 (step S408), and hence contributes to an increase in throughput. Sample shot regions for pre-alignment may be decided such that the first sample shot region for fine alignment becomes the last sample shot region for pre-alignment.

The correlation degrees may be obtained in consideration of not only the detection values of the fine alignment marks FAM in the sample shot regions SH1 to SH6 but also the processing time required for pre-alignment. In this case, the processing time required for pre-alignment includes time costs such as the moving time of the substrate stage 40, the acquisition time of mark images, and the processing time of the mark images. In this case, a correlation degree Col_n can be obtained from equation (2) given below:

$$Col\_n = Wx(PreX-CnX) + Wy(PreY-CnY) + W\theta(Pre\theta - Cn\theta) + Wmag(PreMag-CnMag) + WT(PreT-CnT) \qquad (2)$$

where PreT is the time required to detect the pre-alignment marks PAM in the sample shot regions SL1 and SL2, CnT is the time required to detect the pre-alignment marks PAM in the sample shot regions included in each combination, and WT is a weight to be given to a time cost.

Figure 11:
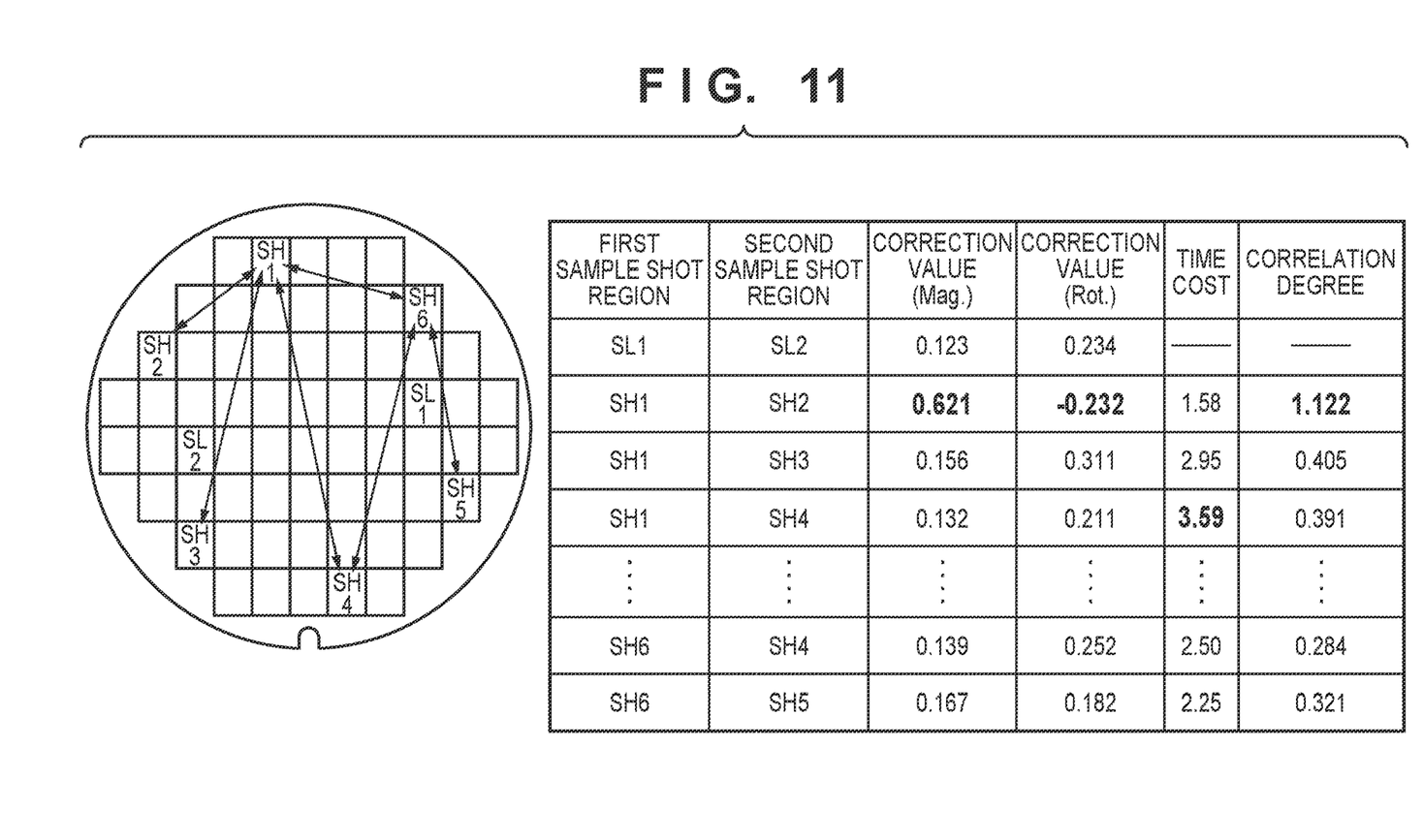
FIG. 11 is a view for explaining the processing of deciding sample shot regions for pre-alignment.

FIG. 11 shows a case in which consideration is given to the time cost of pre-alignment, that is, the correlation degrees obtained from equation (2). FIG. 11 indicates that the correlation degrees are low in combinations exhibiting long inter-sample-shot-region distances as compared with the case shown in FIG. 10 because of consideration to the time cost of pre-alignment.

In general, because the longer the distance between sample shot regions, the higher the certainty of the pre-alignment correction value, the degree of correction of a combination exhibiting a long inter-sample-shot-region distance tends to increase in FIG. 10. Note that considering such temporal elements makes it possible to achieve high throughput while maintaining the certainty of pre-alignment.

As described above, sample shot regions for pre-alignment may be decided also based on the moving time or moving distance of the substrate stage 40 which is required to detect the pre-alignment mark PAM in a sample shot region in pre-alignment.

Figure 12A:
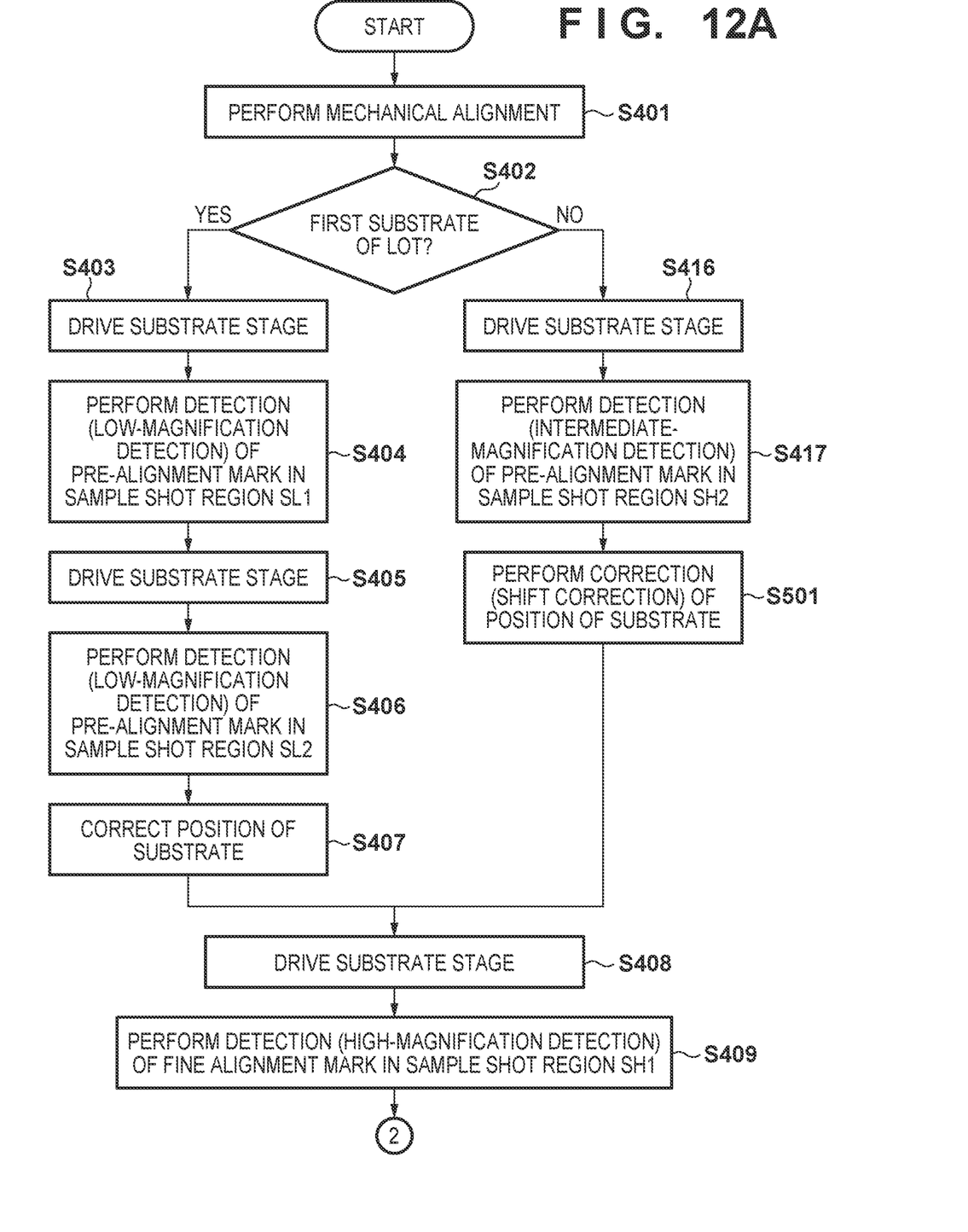
FIGS. 12A and 12B are flowcharts for explaining alignment processing and exposure processing in the exposure apparatus shown in FIG. 1.
Figure 12B:
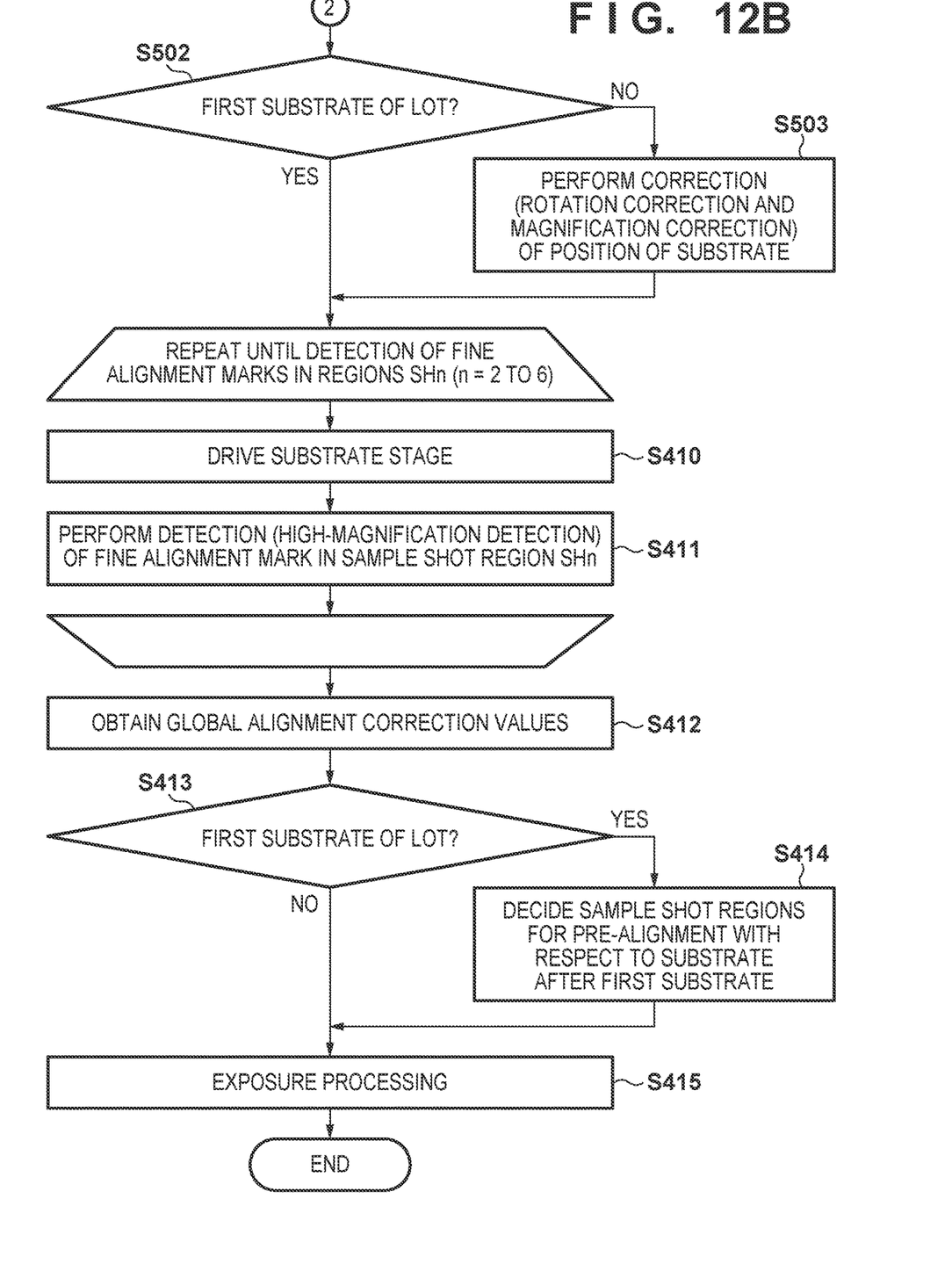

As shown in FIGS. 12A and 12B, it is possible to further increase the throughput by saving the trouble of detecting the pre-alignment mark PAM in the last shot region for pre-alignment with respect to the substrate 30 other than the first substrate of the lot. In this case, in step S501 after step S417, the position of the substrate 30 held by the substrate stage 40 is corrected. More specifically, the shift correction of the substrate 30 is performed based on the detection value of the pre-alignment mark PAM in the sample shot region SH2 which has been obtained in step S417. In step S502 after step S409, it is determined whether the substrate 30 having undergone step S409 is the first substrate 30 of the lot. If the substrate is the first substrate 30 of the lot, the process shifts to step S410. If the substrate is not the first substrate 30 of the lot, the process shifts to step S503. In step S503, the position of the substrate 30 held by the substrate stage 40 is corrected. More specifically, rotation correction and magnification correction are performed for the substrate 30. Such corrections are performed based on the detection value of the pre-alignment mark PAM in the sample shot region SH2, which has been obtained in step S417, and the detection value of the fine alignment mark FAM in the sample shot region SH1, which has been obtained in step S409.

A method of manufacturing an article according to an embodiment of the present invention is suitable for manufacturing an article such as a device (for example, a semiconductor element, magnetic storage medium, or liquid crystal display element). This manufacturing method includes a step of forming a pattern on a substrate by using the exposure apparatus 1, a step of processing the substrate on which the pattern is formed, and a step of manufacturing an article from the processed substrate. This manufacturing method can further include other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The present invention does not limit a lithography apparatus to an exposure apparatus and can apply the lithography apparatus to an imprint apparatus as well. Note that the imprint apparatus brings a mold and an imprint material supplied onto a substrate into contact with each other, and applies curing energy to the imprint material, forming a pattern of a cured product to which a pattern of the mold has been transferred. The above-described article manufacturing method may be performed by using the imprint apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2017-218411 filed on Nov. 13, 2017, which is hereby incorporated by reference herein in its entirety.

What is claimed is:

1. A lithography apparatus that forms patterns on substrates including a first substrate and a second substrate following the first substrate, the apparatus comprising:
   a detection unit configured to detect marks respectively provided in a plurality of shot regions on the first substrate and the second substrate;
   a processing unit configured to perform pre-alignment with respect to the second substrate following fine alignment performed with respect to the first substrate; and
   a control unit configured to:
   obtain a first layout of a plurality of shot regions on the first substrate based on detection values of marks in sample shot regions on the first substrate, the detection values of the marks in the sample shot regions being obtained in the fine alignment performed with respect to the first substrate,
   generate a plurality of different combinations of the sample shot regions on the first substrate of which the detection unit has detected the marks in the fine alignment performed with respect to the first substrate, each of the generated plurality of different combinations of the sample shot regions being constituted by at least two sample shot regions, and
   decide, based on the first layout, sample shot regions to be used as sample shot regions on the second substrate where the detection unit is to detect marks in the pre-alignment to be performed with respect to the second substrate, the decided sample shot regions corresponding to one of the generated plurality of different combinations of the sample shot regions on the first substrate.

2. The apparatus according to claim 1, wherein the control unit is configured to obtain evaluation values of the first layout with respect to a second layout of a plurality of shot regions on the first substrate, which have been obtained in the pre-alignment performed with respect to the first substrate, and to decide sample shot regions included in a combination, among the generated plurality of different combinations, falling within an allowable range of the obtained evaluation values as the sample shot regions on the second substrate where the detection unit is to detect the marks in the pre-alignment to be performed with respect to the second substrate.

3. The apparatus according to claim 1, wherein the control unit is configured to obtain correlation degrees between the first layout and a second layout of a plurality of shot regions on the first substrate which have been obtained in the pre-alignment performed with respect to the first substrate from each of the generated plurality of combinations, and to decide sample shot regions included in a combination, among the generated plurality of different combinations, exhibiting the highest correlation degree as the sample shot regions on the second substrate where the detection unit is to detect the marks in the pre-alignment to be performed with respect to the second substrate.

4. The apparatus according to claim 1, further comprising a stage configured to hold and move the substrate,
   wherein the control unit is further configured to decide the sample shot regions where the detection unit is to detect the marks in the pre-alignment to be performed with respect to the second substrate based on a moving time or a moving distance of the stage which is required to detect the marks in the sample shot regions in the pre-alignment to be performed with respect to the second substrate.

5. The apparatus according to claim 1, wherein the control unit is further configured to decide the sample shot regions where the detection unit is to detect the marks in the pre-alignment to be performed with respect to the second substrate, such that a first sample shot region where the detection unit detects the marks in the fine alignment with respect to the second substrate is a last sample shot region where the detection unit detects the marks in the pre-alignment with respect to the second substrate.

6. The apparatus according to claim 1, wherein the detection unit is configured to detect the marks at a first magnification in the pre-alignment, and to detect the marks at a second magnification higher than the first magnification in the fine alignment.

7. The apparatus according to claim 1, wherein the number of sample shot regions where the detection unit detects the marks in the pre-alignment is not less than two, and
   the number of sample shot regions where the detection unit detects the marks in the fine alignment is not less than the number of sample shot regions where the detection unit detects the marks in the pre-alignment.

8. The apparatus according to claim 1, further comprising a projection optical system configured to project a pattern of a reticle onto the substrate.

9. A lithography method of forming patterns on substrates including a first substrate and a second substrate following the first substrate, the method comprising:
   performing pre-alignment and fine alignment following the pre-alignment with respect to each of the first substrate and the second substrate;
   obtaining a first layout of a plurality of shot regions on the first substrate based on detection values of marks in sample shot regions on the first substrate, the detection values of the marks in the sample shot regions being obtained in the fine alignment performed with respect to the first substrate;
   generating a plurality of different combinations of the sample shot regions on the first substrate of which the marks have been detected in the fine alignment performed with respect to the first substrate before the pre-alignment is performed with respect to the second substrate, each of the generated plurality of different combinations of the sample shot regions being constituted by at least two sample shot regions; and
   deciding, based on the first layout, sample shot regions to be used as sample shot regions on the second substrate where the marks are to be detected in the pre-alignment to be performed with respect to the second substrate, the decided sample shot regions corresponding to one of the generated plurality of different combinations of the sample shot regions on the first substrate.

10. A decision method of deciding, when performing pre-alignment and fine alignment following the pre-alignment with respect to each of a first substrate and a second substrate following the first substrate, a sample shot region where a mark is to be detected in the pre-alignment to be performed with respect to the second substrate, the method comprising:
    obtaining a first layout of a plurality of shot regions on the first substrate based on detection values of marks in sample shot regions on the first substrate, the detection values of the marks in the sample shot regions being obtained in the fine alignment performed with respect to the first substrate;
    generating a plurality of different combinations of the sample shot regions on the first substrate of which the marks have been detected in the fine alignment performed with respect to the first substrate, each of the generated plurality of different combinations of the sample shot regions being constituted by at least two sample shot regions; and
    deciding, based on the first layout, sample shot regions to be used as sample shot regions on the second substrate where the marks are to be detected in the pre-alignment to be performed with respect to the second substrate, the decided sample shot regions corresponding to one of the generated plurality of different combinations of the sample shot regions on the first substrate.

11. A non-transitory computer readable storage medium storing a program for causing a computer to execute a decision method of deciding, when performing pre-alignment and fine alignment following the pre-alignment with respect to each of a first substrate and a second substrate following the first substrate, a sample shot region where a mark is to be detected in the pre-alignment to be performed with respect to the second substrate, the program causing the computer to execute:
    obtaining a first layout of a plurality of shot regions on the first substrate based on detection values of marks in sample shot regions on the first substrate, the detection values of the marks in the sample shot regions being obtained in the fine alignment performed with respect to the first substrate;
    generating a plurality of different combinations of the sample shot regions on the first substrate of which the marks have been detected in the fine alignment performed with respect to the first substrate, each of the generated plurality of different combinations of the sample shot regions being constituted by at least two sample shot regions; and
    deciding, based on the first layout, sample shot regions to be used as sample shot regions on the second substrate where the marks are to be detected in the pre-alignment to be performed with respect to the second substrate, the decided sample shot regions corresponding to one of the generated plurality of different combinations of the sample shot regions on the first substrate.

12. An article manufacturing method comprising:

forming a pattern on a substrate by using a lithography apparatus;

processing the substrate on which the pattern is formed in the forming; and manufacturing an article from the processed substrate, wherein the lithography apparatus forms patterns on the substrates including a first substrate and a second substrate following the first substrate, and includes:

a detection unit configured to detect marks respectively provided in a plurality of shot regions on the first substrate and the second substrate, a processing unit configured to perform pre-alignment with respect to the second substrate following fine alignment performed with respect to the first substrate, and a control unit configured to:

obtain a first layout of a plurality of shot regions on the first substrate based on detection values of marks in sample shot regions on the first substrate, the detection values of the marks in the sample shot regions being obtained in the fine alignment performed with respect to the first substrate, generate a plurality of different combinations of the sample shot regions on the first substrate of which the detection unit has detected the marks in the fine alignment performed with respect to the first substrate, each of the generated plurality of different combinations of the sample shot regions being constituted by at least two sample shot regions, and decide, based on the first layout, sample shot regions to be used as sample shot regions on the second substrate where the detection unit is to detect marks in the pre-alignment to be performed with respect to the second substrate, the decided sample shot regions corresponding to one of the generated plurality of different combinations of the sample shot regions on the first substrate.

* * * * *